(12) United States Patent
Staples et al.

(10) Patent No.: US 7,310,018 B2
(45) Date of Patent: Dec. 18, 2007

(54) METHOD AND APPARATUS PROVIDING INPUT BUFFER DESIGN USING COMMON-MODE FEEDBACK

(75) Inventors: Travis Staples, Meridian, ID (US); Jacob Baker, Boise, ID (US)

(73) Assignee: Micron Technology, Inc., Boise, ID (US)

(*) Notice: Subject to any disclaimer, the term of this patent is extended or adjusted under 35 U.S.C. 154(b) by 163 days.

(21) Appl. No.: 11/208,858

(22) Filed: Aug. 23, 2005

(65) Prior Publication Data

US 2007/0046373 A1   Mar. 1, 2007

(51) Int. Cl.
 *H03F 3/45* (2006.01)
(52) U.S. Cl. ........................ 330/258; 330/260
(58) Field of Classification Search ........... 330/258, 330/253, 260, 261, 257
See application file for complete search history.

(56) References Cited

U.S. PATENT DOCUMENTS

| | | | |
|---|---|---|---|
| 4,571,554 A * | 2/1986 | Martin et al. | 330/252 |
| 4,958,133 A | 9/1990 | Bazes | |
| 6,486,713 B2 | 11/2002 | Wright et al. | |
| 6,806,743 B2 | 10/2004 | Saito et al. | |
| 6,940,328 B2 | 9/2005 | Lin | |
| 7,053,712 B2 * | 5/2006 | Bonaccio et al. | 330/258 |
| 7,164,615 B2 * | 1/2007 | Park et al. | 365/222 |
| 2002/0011877 A1 | 1/2002 | Lim | |
| 2005/0243644 A1 | 11/2005 | Taruishi et al. | |

FOREIGN PATENT DOCUMENTS

JP           407307625 A  * 11/1995

* cited by examiner

*Primary Examiner*—Henry Choe
(74) *Attorney, Agent, or Firm*—Dickstein Shapiro LLP

(57) ABSTRACT

An input buffer includes a first stage for receiving an input signal and having a first pair of complementary output signals, the first stage including an input circuit for receiving the input signal, an output circuit for generating the first pair of complementary output signals based on the input signal, a resistance feedback circuit connected to the first pair of complementary output signals and generating a feedback signal, and a common mode circuit for balancing the complementary outputs based on the feedback signal.

50 Claims, 6 Drawing Sheets

METHOD AND APPARATUS PROVIDING INPUT BUFFER DESIGN USING COMMON-MODE FEEDBACK

FIELD OF THE INVENTION

The present invention relates to an input buffer design.

BACKGROUND OF THE INVENTION

Input buffers driven with single-ended signals, yet having differential outputs can be used, for instance, in signal processing where a signal must be transmitted over long distances with minimal signal degradation due to interference from external sources, i.e. noise. The differential output signal is produced to be output over two lines as a positive and negative form of the input signal. Because any signal noise would most likely affect both lines equally, the noise component may be removed from the signal by subtracting the two outputs.

One problem associated with input buffers driven with single-ended input signals is ensuring a balanced differential output. FIG. 1A illustrates a schematic of a conventional input buffer 100 depicted as an operational amplifier. The amplifier 100 receives an input voltage Vin at a positive terminal and a reference voltage Vref at a negative terminal. The amplifier 100 outputs differential outputs Vout+, Vout− based on the input voltage Vin. As shown in FIG. 1B, when the input buffer is used as a comparator, the input signal Vin received by the conventional input buffer 100 may oscillate around the reference voltage Vref. FIG. 1C shows the differential outputs Vout+, Vout− from the conventional input buffer 100. As shown, the outputs Vout+, Vout− are not balanced; i.e., Vout− should be the exact inverse of Vout+, such that the crossing points 150 of the two output signals Vout+, Vout− occur where if the output signals Vout+, Vout− were added, the net result would be zero.

FIG. 2 illustrates a circuit diagram of a conventional input buffer 200 that is driven with single-ended signals Vin and Vref and generates an unbalanced negative output signal Vout−. Input buffer 200 includes a first stage circuit 280 and a second stage circuit 290. The first stage circuit 280 includes a first input transistor 201 for receiving the input signal Vin at a gate terminal 201', a second input transistor 202 for receiving a reference voltage Vref at a gate terminal 202', first and second general feedback transistors 203, 204 having associated gates 203', 204', and third and fourth general feedback transistors 207, 208 with associated gates 207', 208'. The gates 203', 204' of the first and second general feedback transistors 203, 204 are electrically connected to each other, and the gates 207', 208' of the third and fourth general feedback transistors 207, 208 are electrically connected to each other. Also, a drain terminal of each of the third and fourth general feedback transistors 207, 208 is respectively electrically connected to a source terminal of each of the first and second input transistors 201, 202. The first stage circuit 280 further includes an output node 209 at which positive output Vout+ is generated. The output node 209 is electrically connected to the drain terminal of the fourth general feedback transistor 208 and to the source terminal of the second input transistor 202. In addition, first stage circuit 280 includes a first connection node 220 which is connected to a drain terminal of the third general feedback transistor 207, to a source terminal of the first input transistor 201, to the gates 203', 204' of the first and second general feedback transistors 203, 204, and to the gates 207', 208' of the third and fourth general feedback transistors 207, 208.

Enable transistors 211, 212 may be connected between a power source Vcc and a source terminal of the third and fourth general feedback transistors 207, 208. The enable transistors 211, 212 receive an enable signal EN at a gate terminal 211', 212' to activate the first stage circuit 280.

The second stage circuit 290 includes a third input transistor 250 for receiving the output voltage Vout+ at a gate terminal 250', fifth and sixth general feedback transistors 252, 253 having associated gates 252', 253', and seventh and eighth general feedback transistors 254, 255 with associated gates 254', 255'. The gates 252', 253' of the fifth and sixth general feedback transistors 252, 253 are electrically connected to each other, and the gates 254', 255' of the seventh and eighth general feedback transistors 254, 255 are electrically connected to each other. Also, a drain terminal of the seventh general feedback transistor 254 is electrically connected to a source terminal of the third input transistor 250, and a drain terminal of the eighth general feedback transistor 255 is electrically connected to a source terminal of the sixth general feedback transistor 253. The second stage circuit 290 further includes an output node 256 at which negative output Vout− is generated. The output node 256 is electrically connected to the drain terminal of the eighth general feedback transistor 255 and to the source terminal of the sixth general feedback transistor 253. In addition, second stage circuit 290 includes a second connection node 260 which is connected to a drain terminal of the seventh general feedback transistor 254, to a source terminal of the third input transistor 250, to the gates 252', 253' of the fifth and sixth general feedback transistors 252, 253, and to the gates 254', 255' of the seventh and eighth general feedback transistors 254, 255.

Enable transistors 257, 258 may be connected between a power source Vcc and a source terminal of each of the third and fourth general feedback transistors 254, 255. The enable transistors 257, 258 receive an enable signal EN at a gate terminal 257', 258' to activate the second stage circuit 290.

The configuration of the conventional input buffer driven with single-ended signals and outputting only negative output signals generates unbalanced positive and negative output signals, such as that illustrated in FIG. 1C. Accordingly, there is a desire for a input buffer driven with single-ended signals that generates a better balanced differential output.

BRIEF SUMMARY OF THE INVENTION

The present invention provides exemplary embodiments in which common mode feedback is used to obtain an optimized balanced differential output from an input buffer driven by a single-ended input signal.

One exemplary embodiment provides an input buffer, and method of forming the input buffer, having a first stage for receiving an input signal and having a first pair of complementary output signals, the first stage including an input circuit for receiving the input signal, an output circuit for generating the first pair of complementary output signals based on the input signal a resistance feedback circuit connected to the first pair of complementary output signals and generating a feedback signal, and a common mode circuit for balancing the complementary outputs based on the feedback signal.

BRIEF DESCRIPTION OF THE DRAWINGS

Other features and advantages of the present invention will become apparent from the following description of the invention which refers to the accompanying drawings, in which.

DETAILED DESCRIPTION OF THE INVENTION

In the following detailed description, reference is made to the accompanying drawings, which form a part hereof and show by way of illustration specific embodiments in which the invention may be practiced. These embodiments are described in sufficient detail to enable those skilled in the art to practice the invention, and it is to be understood that other embodiments may be utilized, and that structural, logical, and electrical changes may be made without departing from the spirit and scope of the present invention. The progression of processing steps described is exemplary of embodiments of the invention; however, the sequence of steps is not limited to that set forth herein and may be changed as is known in the art, with the exception of steps necessarily occurring in a certain order.

Figure 1A:
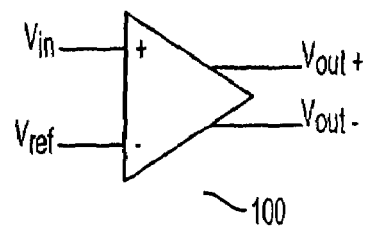
FIG. 1A is a schematic of a conventional input buffer.
Figure 1B:
FIG. 1B is a voltage chart illustrating exemplary input voltages of a conventional input buffer.
Figure 1C:
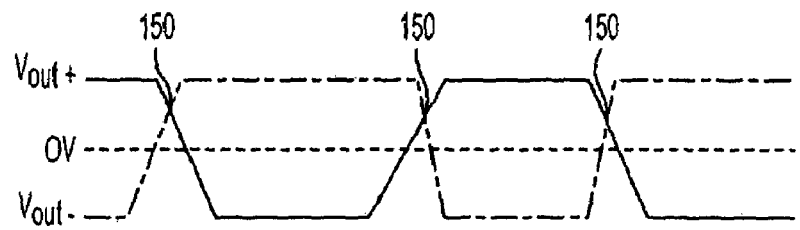
FIG. 1C is a voltage chart illustrating output voltages of a conventional input buffer based on exemplary input voltages.
Figure 2:
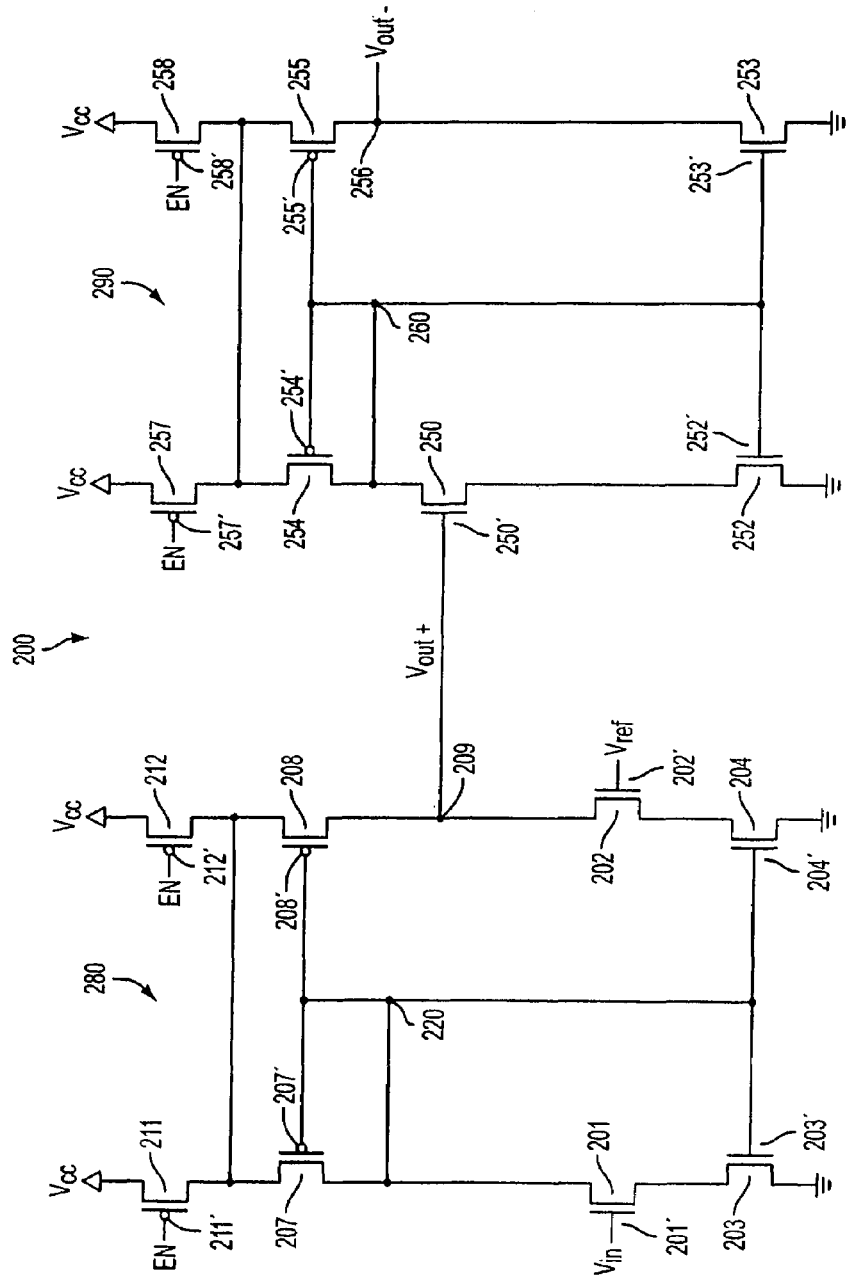
FIG. 2 is a circuit diagram of a conventional input buffer.
Figure 3:
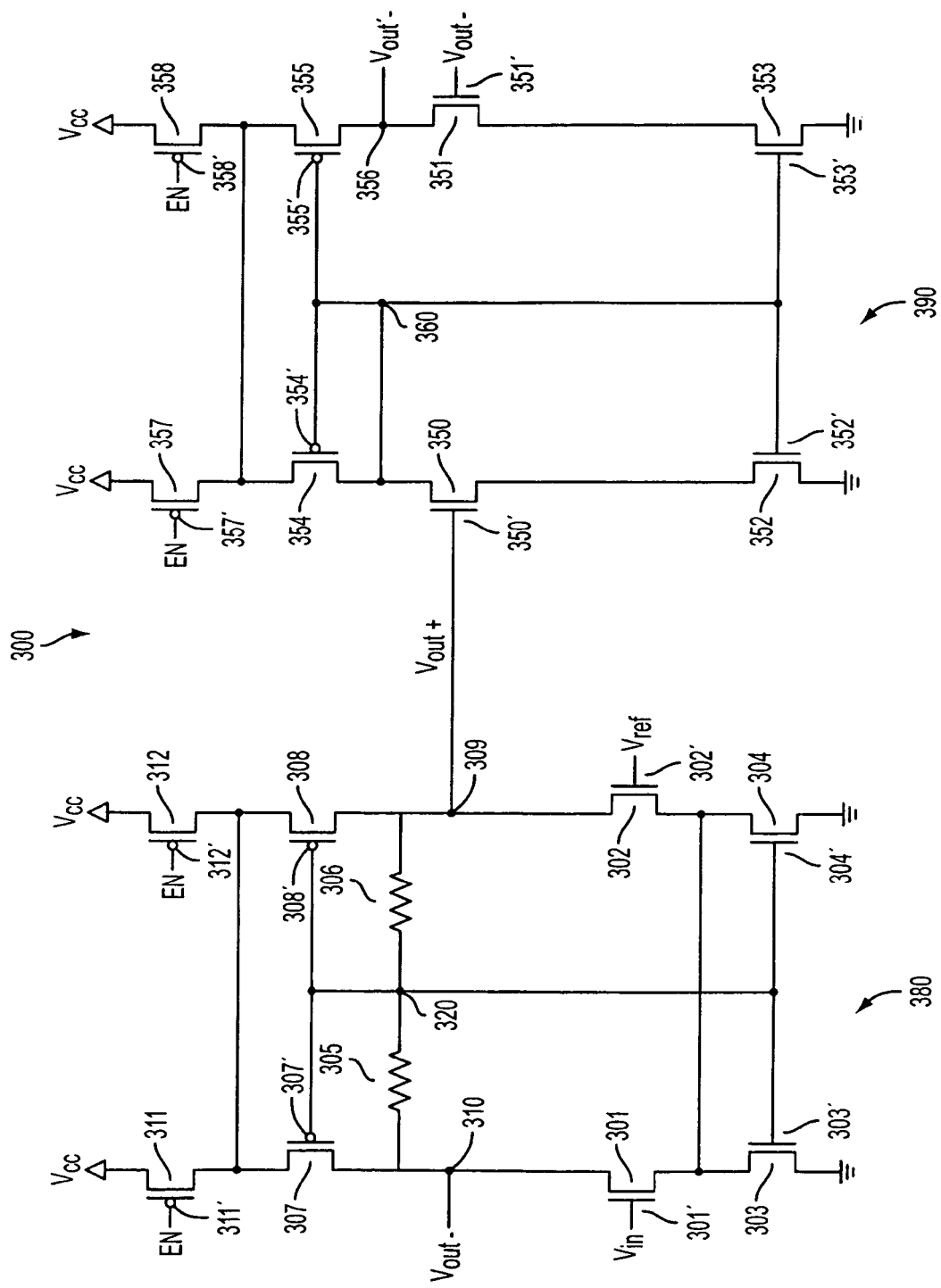
FIG. 3 is a circuit diagram of an input buffer constructed in accordance with an exemplary embodiment of the present invention.

Now referring to the figures, where like numerals designate like elements, FIG. 3 illustrates a circuit diagram of an input buffer 300 of the invention, which includes a first stage circuit 380 and a second stage circuit 390. The first stage circuit 380 includes a first input transistor 301 for receiving an input signal Vin at a gate terminal 301', a second input transistor 302 for receiving a reference voltage Vref at a gate terminal 302', a first common mode feedback transistor 303 having an associated gate 303', wherein a source terminal of the first common mode feedback transistor 303 is electrically connected to a drain terminal of the first input transistor 301, a second common mode feedback transistor 304 having an associated gate 304'. The gates 303', 304' of the first and second common mode feedback transistors 303, 304 are electrically connected to each other, a source terminal of the second common mode feedback transistor 304 is electrically connected to a drain terminal of the second input transistor 302, and the source terminals of the first and second common mode feedback transistors 303, 304 are electrically connected to each other. First stage circuit 380 further includes a resistance circuit, shown in FIG. 3 as including first and second resistors 305, 306, which is electrically connected between the source terminals of first and second input transistors 301, 302. In addition, first stage circuit 380 also includes first and second output drive transistors 307, 308 for generating differential output signals Vout+, Vout−. A drain terminal of each of the first and second output drive transistors 307, 308 is respectively electrically connected to the resistance circuit 305, 306. Vout+ and Vout− are generated respectively at output nodes 309, 310. First stage circuit 380 further includes a first connection node 320 between resistors 305, 306 to which are connected the gates 303', 304' of first and second common mode feedback transistors 303, 304, and the gates 307', 307' of first and second output transistors 307, 308.

Enable transistors 311, 312 may be connected between a power source Vcc and a source terminal of each of the output drive transistors 307, 308. The enable transistors 311, 312 receive an enable signal EN at a gate terminal 311', 312' to activate the first stage circuit 380. In the illustrated embodiment, first and second input transistors 301, 302 and common mode feedback transistors 303, 304 are n-type, and output drive transistors 307, 308 and enable transistors 311, 312 are p-type, although this illustration is not intended to limit the invention to such a configuration.

The second stage circuit 390 includes third and fourth input transistors 350, 351, for respectively receiving the positive output voltage Vout+ and inversed/negative output voltage Vout− from first stage circuit 380 at gate terminals 350', 351', first and second general feedback transistors 352, 353 having associated gates 352', 353', and third and fourth general feedback transistors 354, 355 with associated gates 354', 355'. The gates 352', 353' of the first and second general feedback transistors 352, 353 are electrically connected to each other, and the gates 354', 355' of the third and fourth general feedback transistors 354, 355 are electrically connected to each other. Also, a drain terminal of each of the third and fourth general feedback transistors 354, 355 is respectively electrically connected to a source terminal of each of the third and fourth input transistors 350, 351. The second stage circuit 390 further includes an output node 356 at which negative output Vout'− is generated. The output node 356 is electrically connected to the drain terminal of the fourth general feedback transistor 355 and to the source terminal of the fourth input transistor 351. In addition, second stage circuit 390 includes a second connection node 360 which is connected to a drain terminal of the third general feedback transistor 354, to a source terminal of the third input transistor 350, to the gates 352', 353' of the first and second general feedback transistors 352, 353, and to the gates 354', 355' of the third and fourth general feedback transistors 354, 355.

Enable transistors 357, 358 may be connected between a power source Vcc and a source terminal of each of the third and fourth general feedback transistors 354, 355. The enable transistors 357, 358 receive an enable signal EN at a gate terminal 357', 358' to activate the second stage circuit 390. In the illustrated embodiment, third and fourth input transistors 350, 351 and first and second general feedback transistors 352, 353 are n-type, and third and fourth general feedback transistors 354, 355 and enable transistors 357, 358 are p-type, although this illustration is not intended to limit the invention to such a configuration.

Figure 4:
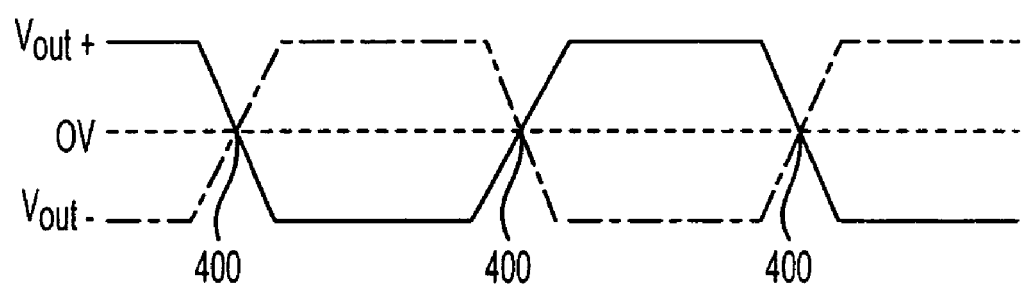
FIG. 4 is a voltage chart of the output voltages of an input buffer constructed in accordance with an exemplary embodiment of the present invention.

FIG. 4 illustrates the optimized differential output voltages generated by first stage circuit 380. Vout− is the inverse of Vout+, such that the crossing points 400 of the two output signals Vout+, Vout− occur where the voltages are zero and the output signals Vout+, Vout− would cancel each other if added. The absolute values of Vout+ and Vout− are equal at all points.

Hence, the present invention describes an input buffer including a first stage for receiving an input signal and generating a first pair of complementary output signals. The first stage includes an input circuit for receiving the input signal, an output circuit for generating the first pair of complementary output signals based on the input signal, a resistance feedback circuit for averaging the first pair of complementary output signals and generating a feedback signal corresponding to the average, and a common mode circuit for balancing the complementary outputs based on the feedback signal. The input buffer may also optionally include a second stage connected to the first pair of outputs and generating a second pair of outputs from the balanced first pair of complementary outputs.

Figure 5:
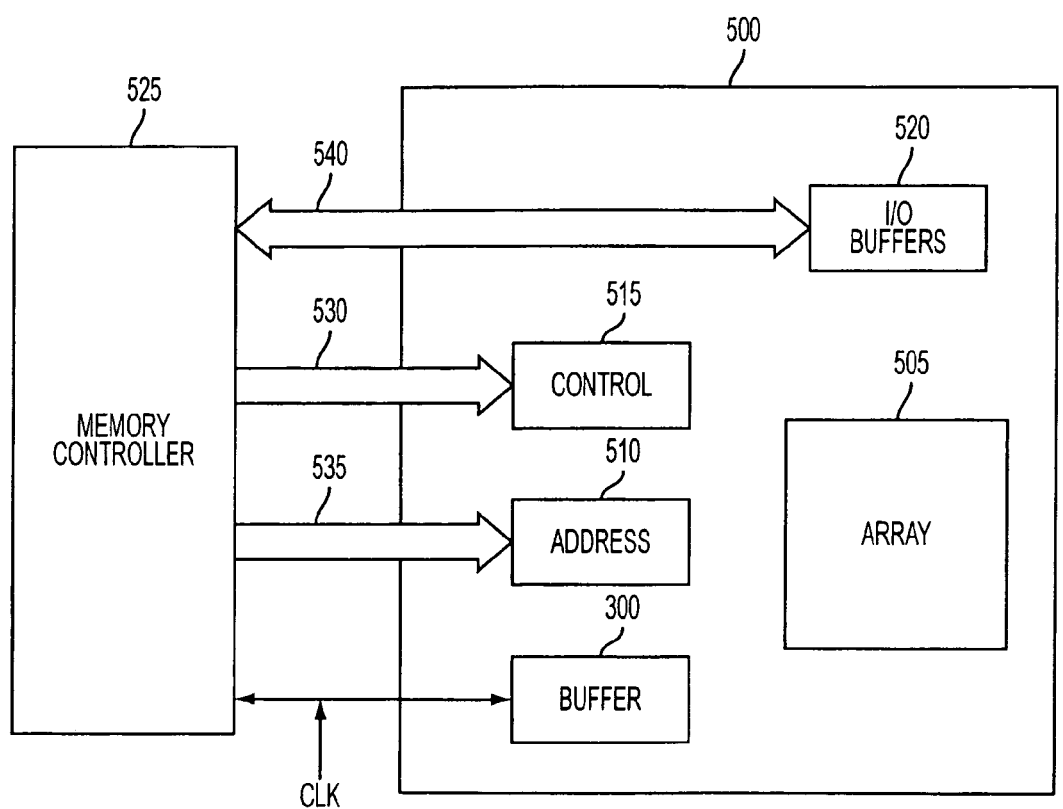
FIG. 5 is a block diagram of a synchronous memory device incorporating an input buffer constructed in accordance with an exemplary embodiment of the present invention.

The above described single-ended input buffer generating differential output signals is particularly useful in an integrated memory circuit. In particular, the input buffer is useful in synchronous memory devices such as a synchronous dynamic random access memory (SDRAM). A simplified block diagram of an SDRAM 500 is illustrated in FIG. 5. The SDRAM includes an array of memory cells 505, address circuitry 510 for addressing the memory array, a differential input buffer 300 for receiving a clock signal (CLK), and control circuitry 515 for controlling the operation of the memory device. The differential input buffer 300 includes the circuitry described above with respect to FIG. 3 for reducing clock skew. Input/output (I/O) buffer circuitry 520 is provided for data input and output. An external memory controller 525 is typically used to provide control signals on lines 530, address signals on lines 535, and transmit and receive data on lines 540. It will be appreciated by those skilled in the art that the SDRAM of FIG. 5 is simplified to illustrate the present invention and is not intended to be a detailed description of all of the features of an SDRAM. It should also be understood that while a single SDRAM device is shown in FIG. 5, that in practice there will be a plurality of SDRAM devices connected to controller 525 and that one or more SDRAM devices may be contained on a memory module. In addition to clock signals, the invention may be used for address signals, data signals, command signals, and other signals where generating a balanced differential output would be beneficial.

Figure 6:
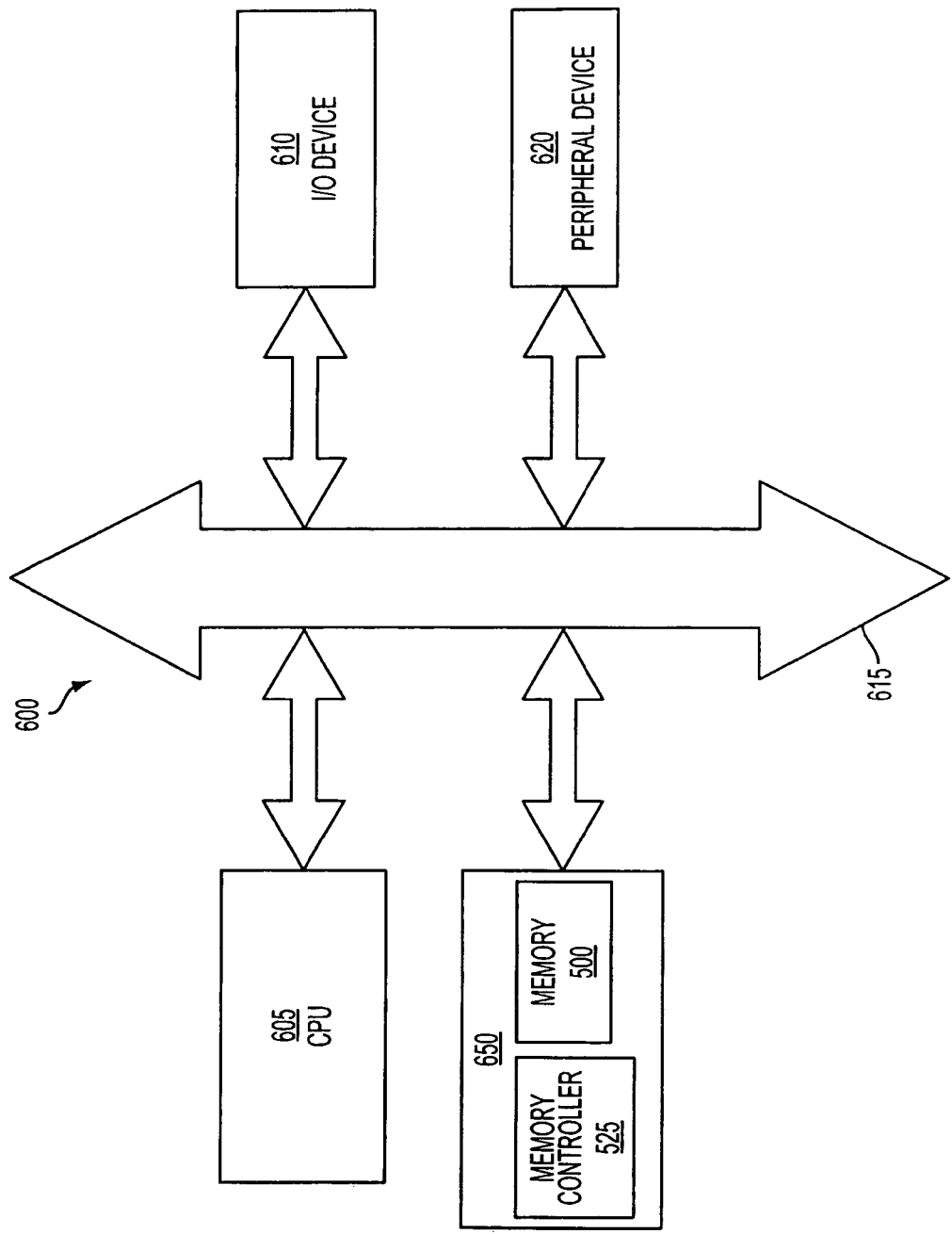
FIG. 6 is a schematic diagram of a processing system employing a synchronous memory device having an input buffer an input buffer constructed in accordance with an exemplary embodiment of the present invention.

FIG. 6 illustrates a typical processor system 600 which includes a memory device 650, which includes an input buffer 300 constructed in accordance with an exemplary embodiment of the present invention, and the memory device 500 and memory controller 525 as shown in FIG. 5. A processor system, such as a computer system, generally comprises a central processing unit (CPU) 605, such as a microprocessor, a digital signal processor, or other programmable digital logic devices, which communicates with an input/output (I/O) device 610 over a bus 615. The memory device 500 communicates with the CPU 605 over bus 615 typically through a memory controller.

In the case of a computer system, the processor system may include peripheral devices 620, such as a floppy disk drive or a compact disc (CD) ROM drive, which also communicate with CPU 605 over the bus 615. Memory device 500 is preferably constructed as an integrated circuit, which includes one or more input buffers, e.g., input buffer 300. If desired, the memory device 500 may be combined with the processor, for example CPU 605, in a single integrated circuit.

The processes and devices described above illustrate preferred methods and typical devices of many that could be used and produced. The above description and drawings illustrate embodiments, which achieve the objects, features, and advantages of the present invention. However, it is not intended that the present invention be strictly limited to the above-described and illustrated embodiments. For example, although the invention is discussed only with reference to input buffers using p-type and n-type transistors as described, other input buffers using common mode feedback are also intended to be within the scope of the invention. Additionally, any modifications, though presently unforeseeable, of the present invention that come within the spirit and scope of the following claims should be considered part of the present invention.

What is claimed as new and disired to be protected by Letters Patent of the United States is:

1. An input buffer comprising:
   a first stage for receiving an input signal and having a first pair of complementary output signals, said first stage comprising:
   an input circuit for receiving said input signal;
   an output circuit for generating said first pair of complementary output signals based on said input signal;
   a resistance feedback circuit for receiving the first pair of complementary output signals and generating a feedback signal; and
   a common mode circuit for balancing said complementary output signals based on said feedback signal; and
   a second stage connected to said balanced first pair of complementary output signals and for generating a third output from said balanced first pair of complementary output signals.

2. The input buffer of claim 1, wherein said input circuit comprises a first pair of transistors,
   wherein the source and drain terminals of said first pair of transistors are connected respectively to said resistance circuit and to said common mode circuit.

3. An input buffer comprising:
   a first stage for receiving an input signal and having a first pair of complementary output signals, said first stage comprising:
   an input circuit for receiving said input signal;
   an output circuit for generating said first pair of complementary output signals based on said input signal;
   a resistance feedback circuit for receiving the first pair of complementary output signals and generating a feedback signal; and
   a common mode circuit for balancing said complementary output signals based on said feedback signal,
   wherein said output circuit comprises a second pair of transistors,
   wherein the gate terminals of said second pair of transistors are connected to each other, and
   the drain terminals of said second pair of transistors are connected to said resistance circuit.

4. The input buffer of claim 3, wherein said common mode circuit comprises a third pair of transistors,
   wherein the source terminals of said third pair of transistors are connected to said first input circuit.

5. The input buffer of claim 4, wherein the gates of said third pair of transistors are connected to each other.

6. The input buffer of claim 4, wherein the gates of said third pair of transistors are connected to said resistance feedback circuit.

7. An input buffer comprising:
a first stage for receiving an input signal and having a first pair of complementary output signals, said first stage comprising:
an input circuit for receiving said input signal;
an output circuit for generating said first pair of complementary output signals based on said input signal;
a resistance feedback circuit for receiving the first pair of complementary output signals and generating a feedback signal; and
a common mode circuit for balancing said complementary output signals based on said feedback signal.
wherein said resistance feedback circuit comprises a pair of resistors, said pair of resistors are connected to each other, said pair of resistors are connected to said common mode feedback circuit, and said pair of resistors are connected to said output circuit.

8. A method of forming an input buffer comprising:
forming a first stage for receiving an input signal and having a first pair of complementary output signals, said forming comprising:
forming an input circuit for receiving said input signal;
forming an output circuit for generating said first pair of complementary output signals based on said input signal;
forming a resistance feedback circuit for receiving the first pair of complementary output signals and generating a feedback signal; and
forming a common mode circuit for balancing said complementary output signals based on said feedback signal; and
forming a second stage for receiving said balanced first pair of complementary output signals and generating a third output based on said balanced first pair of complementary output signals.

9. The method of claim 8, wherein said step of forming a an input circuit comprises forming a first pair of transistors, wherein the source and drain terminals of said first pair of transistors are connected respectively to said resistance circuit and to said common mode circuit.

10. A method of forming an input buffer comprising:
forming a first stage for receiving an input signal and having a first pair of complementary output signals, said forming comprising:
forming an input circuit for receiving said input signal;
forming an output circuit for generating said first pair of complementary output signals based on said input signal;
forming a resistance feedback circuit for receiving the first pair of complementary output signals and generating a feedback signal; and
forming a common mode circuit for balancing said complementary output signals based on said feedback signal,
wherein said step of forming an input circuit comprises forming a first pair of transistors,
wherein the source and drain terminals of said first pair of transistors are connected respectively to said resistance circuit and to said common mode circuit, and
wherein said step of forming an output circuit comprises forming a second pair of transistors,
wherein the gate terminals of said second pair of transistors are connected to each other, and the drain terminals of said second pair of transistors are connected to said resistance circuit.

11. The method of claim 10, wherein said step of forming a common mode circuit comprises forming a third pair of transistors,
wherein the source terminals of said third pair of transistors are connected to said first input circuit.

12. The method of claim 11, wherein the gates of said third pair of transistors are connected to each other.

13. The method of claim 11, wherein the gates of said third pair of transistors are connected to said resistance feedback circuit.

14. A method of forming an input buffer comprising:
forming a first stage for receiving an input signal and having a first pair of complementary output signals, said forming comprising:
forming an input circuit for receiving said input signal;
forming an output circuit for generating said first pair of complementary output signals based on said input signal;
forming a resistance feedback circuit for receiving the first pair of complementary output signals and generating a feedback signal; and
forming a common mode circuit for balancing said complementary output signals based on said feedback signal,
wherein said step of forming a resistance feedback circuit comprises forming a pair of resistors, said pair of resistors are connected to each other, said pair of resistors are connected to said common mode feedback circuit, and said pair of resistors are connected to said output circuit.

15. An input buffer comprising:
a first stage circuit comprising:
a first input transistor of a first doping type for receiving an input signal at a gate terminal;
a second input transistor of said first doping type for receiving a reference voltage at a gate terminal;
a first common mode feedback transistor of said first doping type having an associated gate, wherein a source terminal of said first common mode feedback transistor is electrically connected to a drain terminal of said first input transistor;
a second common mode feedback transistor of said first doping type having an associated gate, wherein:
said gates of said first and second common mode feedback transistors being electrically connected to each other,
a source terminal of said second common mode feedback transistor is electrically connected to a drain terminal of said second input transistor,
and said source terminals of said first and second common mode feedback transistors being electrically connected to each other;
a resistance circuit electrically connected to a source terminal of said first input transistor and to a source terminal of said second input transistor;
first and second output drive transistors of a second doping type for generating a differential output,
wherein a drain terminal of each of said first and second output drive transistors is respectively electrically connected to said resistance circuit; and
a first connection node, wherein:
said gates of said first and second common mode feedback transistors are connected to said first connection node, said gates of said first and second output drive transistors are connected to said first connection node, and said resistance circuit is connected to said first connection node.

16. The input buffer of claim 15, further comprising:

an enable signal input terminal connected to a source terminal of said output drive transistors.

17. The input buffer of claim 15, wherein said resistance circuit comprises a pair of resistors.

18. The input buffer of claim 15, further comprising:

a second stage circuit connected to said differential output.

19. The input buffer of claim 18, wherein said second-stage circuit comprises:

third and fourth input transistors of said first doping type for receiving respectively said output voltage and inversed output voltage at a gate terminal;

first and second general feedback transistors of said first doping type having associated gates which are electrically connected;

third and fourth general feedback transistors of said second doping type with associated gates, wherein:

said gates of said third and fourth general feedback transistors are electrically connected to each other;

said gates of said third and fourth general feedback transistors are electrically connected to said gates of said first and second general feedback transistors, a drain terminal of each of said third and fourth general feedback transistors is electrically connected respectively to a source terminal of each of said third and fourth input transistors; and an output electrically connected to said drain terminal of said fourth general feedback transistor and to said source terminal of said fourth input transistor, wherein a drain terminal of said third general feedback transistor is electrically connected to a source terminal of said third input transistor and to said gates of said third and fourth general feedback transistors.

20. A memory device comprising:

a memory array containing a plurality of memory cells; and an input buffer for receiving signals related to operation of said array, said input buffer comprising:

a first stage for receiving an input signal and having a first pair of complementary output signals, said first stage comprising:

an input circuit for receiving said input signal;

an output circuit for generating said first pair of complementary output signals based on said input signal;

a resistance feedback circuit for receiving the first pair of complementary output signals and generating a feedback signal; and a common mode circuit for balancing said complementary output signals based on said feedback signal; and a second stage for receiving said balanced first pair of complementary output signals and generating a third output from said balanced first pair of complementary output signals.

21. The memory device of claim 20, wherein said signals related to operation of said array are clock signals.

22. The memory device of claim 20, wherein said signals related to operation of said array are data signals.

23. The memory device of claim 20, wherein said signals related to operation of said array are address signals.

24. The memory device of claim 20, wherein said signals related to operation of said array are control signals.

25. The memory device of claim 20, wherein said input circuit comprises a first pair of transistors, and the source and drain terminals of said first pair of transistors are connected respectively to said resistance circuit and to said common mode circuit.

26. A memory device comprising:

a memory array containing a plurality of memory cells; and an input buffer for receiving signals related to operation of said array, said input buffer comprising:

a first stage for receiving an input signal and having a first pair of complementary output signals, said first stage comprising:

an input circuit for receiving said input signal;

an output circuit for generating said first pair of complementary output signals based on said input signal;

a resistance feedback circuit for receiving the first pair of complementary output signals and generating a feedback signal; and a common mode circuit for balancing said complementary output signals based on said feedback signal;

wherein said input circuit comprises a first pair of transistors.

the source and drain terminals of said first pair of transistors are connected respectively to said resistance circuit and to said common mode circuit, the output circuit comprises a second pair of transistors, the gate terminals of said second pair of transistors are connected to each other, and the drain terminals of said second pair of transistors are connected to said resistance circuit.

27. The memory device of claim 26, wherein said common mode circuit comprises a third pair of transistors, and the source terminals of said third pair of transistors are connected to said first input circuit.

28. The memory device of claim 27, wherein the gates of said third pair of transistors are connected to each other.

29. The memory device of claim 28, wherein the gates of said third pair of transistors are connected to said resistance feedback circuit.

30. The memory device of claim 20, wherein said resistance feedback circuit comprises a pair of resistors, said pair of resistors are connected to each other, said pair of resistors are connected to said common mode feedback circuit, and said pair of resistors are connected to said output circuit.

31. A processing system comprising:

a processor; and a memory device coupled to said central processing unit to receive data from and supply data to said central processing unit, said memory device comprising:

a memory array containing a plurality of memory cells; and an input buffer for receiving signals related to operation of said array, said input buffer comprising:

a first stage for receiving an input signal and having a first pair of complementary output signals, said first stage comprising:

an input circuit for receiving said input signal;

an output circuit for generating said first pair of complementary output signals based on said input signal;

a resistance feedback circuit for receiving the first pair of complementary output signals and generating a feedback signal; and a common mode circuit for balancing said complementary output signals based on said feedback signal; and a second stage for receiving said balanced first pair of complementary output signals and generating a third output from said balanced first pair of complementary output signals.

32. The processing system of claim 31, wherein said signals related to operation of said array are clock signals.

33. The processing system of claim 31, wherein said signals related to operation of said array are data signals.

34. The processing system of claim 31, wherein said signals related to operation of said array are address signals.

35. The processing system of claim 31, wherein said signals related to operation of said array are control signals.

36. The processing system of claim 31, wherein said input circuit comprises a first pair of transistors, wherein the source and drain terminals of said first pair of transistors are connected respectively to said resistance circuit and to said common mode circuit.

37. A processing system comprising:

a processor; and a memory device coupled to said central processing unit to receive data from and supply data to said central processing unit, said memory device comprising:

a memory array containing a plurality of memory cells; and an input buffer for receiving signals related to operation of said array, said input buffer comprising:

a first stage for receiving an input signal and having a first pair of complementary output signals, said first stage comprising:

an input circuit for receiving said input signal;

an output circuit for generating said first pair of complementary output signals based on said input signal;

a resistance feedback circuit for receiving the first pair of complementary output signals and generating a feedback signal; and a common mode circuit for balancing said complementary output signals based on said feedback signal;

wherein said input circuit comprises a first pair of transistors, the source and drain terminals of said first pair of transistors are connected respectively to said resistance circuit and to said common mode circuit, the output circuit comprises a second pair of transistors, the gate terminals of said second pair of transistors are connected to each other, and the drain terminals of said second pair of transistors are connected to said resistance circuit.

38. The processing system of claim 37, wherein said common mode circuit comprises a third pair of transistors, wherein the source terminals of said third pair of transistors are connected to said first input circuit.

39. The processing system of claim 38, wherein the gates of said third pair of transistors are connected to each other.

40. The processing system of claim 39, wherein the gates of said third pair of transistors are connected to said resistance feedback circuit.

41. The processing system of claim 31, wherein said resistance feedback circuit comprises a pair of resistors, said pair of resistors are connected to each other, said pair of resistors are connected to said common mode feedback circuit, and said pair of resistors are connected to said output circuit.

42. An input buffer comprising:

a first stage circuit comprising:

a first input transistor for receiving an input signal at a gate terminal;

a second input transistor for receiving a reference signal at a gate terminal;

a first common mode feedback transistor having an associated gate, wherein a source terminal of said first common mode feedback transistor is electrically connected to a drain terminal of said first input transistor;

a second common mode feedback transistor having an associated gate, wherein said gates of said first and second common mode feedback transistors being electrically connected to each other, a source terminal of said second common mode feedback transistor is electrically connected to a drain terminal of said second input transistor, and said source terminals of said first and second common mode feedback transistors being electrically connected to each other;

a resistance circuit electrically connected to a source terminal of said first input transistor and to a source terminal of said second input transistor;

first and second output drive transistors for generating respective first and second balanced voltages, such that a net sum of said first and second balanced voltages equals zero, wherein a drain terminal of each of said first and second output drive transistors is respectively electrically connected to said resistance circuit;

a first connection node, wherein:

said gates of said first and second common mode feedback transistors are connected to said first connection node, said gates of said first and second output drive transistors are connected to said first connection node, and said resistance circuit is connected to said first connection node; and a second stage circuit for receiving said balanced first and second voltages and outputting a third voltage having an absolute value equal to said balanced first and second voltages.

43. A circuit comprising:

a first stage for outputting first and second complementary output signals, said first stage comprising:

an input circuit comprising a first input transistor for receiving an input signal and a second input transistor for receiving a reference signal, said first and second input transistors being of a first conductivity type;

an output circuit comprising first and second output transistors for respectively generating said first and second complementary output signals based on said input signal and said reference signal, said first and second output transistors being of a second conductivity type;

a resistance feedback circuit connected to said first and second output transistors and for generating a feedback signal; and a common mode circuit for balancing said first and second complementary output signals based on said feedback signal such that respective amplitudes of said balanced first and second complementary output signals maintain a same absolute value.

44. The input buffer of claim 43, further comprising:
a second stage connected to said output circuit and for generating a third output signal from said balanced first and second complementary output signals.

45. The input buffer of claim 44, wherein the second stage comprises third and fourth input transistors for respectively receiving said balanced first and second complementary output signals.

46. A method of forming an input buffer comprising:
forming a first stage for generating a differential output, said first stage comprising:
forming an input circuit comprising a first input transistor for receiving an input signal and a second input transistor for receiving a reference signal, said first and second input transistors being of a first conductivity type;
forming an output circuit comprising first and second output transistors for respectively generating first and second complementary output signals based on said input signal and said reference signal, said first and second output transistors being of a second conductivity type;
forming a resistance feedback circuit for receiving said first and second complementary output signals and generating a feedback signal based on said first and second complementary output signals; and
forming a common mode circuit for balancing said first and second complementary output signals based on said feedback signal such that said first and second complementary output signals maintain inverse amplitudes of equal absolute magnitude.

47. The method of claim 46, further comprising:
forming a second stage connected to said first and second output transistors and for generating a third output signal from said balanced first and second complementary output signals.

48. The input buffer of claim 47, wherein forming the second stage comprises forming third and fourth input transistors having respective gates each receiving a different one of said first and second complementary output signals.

49. A processing system comprising:
a processor; and
a memory device coupled to said central processing unit to receive data from and supply data to said central processing unit, said memory device comprising:
a memory array containing a plurality of memory cells; and
an input buffer for receiving signals related to operation of said array, said input buffer comprising:
an input circuit comprising a first input transistor for receiving an input signal and a second input transistor for receiving a reference signal, said first and second input transistors being of a first conductivity type;
an output circuit comprising first and second output transistors for respectively generating said first and second complementary output signals based on said input signal and said reference signal, said first and second output transistors being of a second conductivity type;
a resistance feedback circuit connected to said first and second output transistors and for generating a feedback signal; and
a common mode circuit for balancing said first and second complementary output signals based on said feedback signal.

50. The processing system of claim 49, further comprising a second stage connected to said first and second output transistors and for generating a third output signal from said balanced first and second complementary output signals.

* * * * *

UNITED STATES PATENT AND TRADEMARK OFFICE
CERTIFICATE OF CORRECTION

| | |
|---|---|
| PATENT NO. | : 7,310,018 B2 |
| APPLICATION NO. | : 11/208858 |
| DATED | : December 18, 2007 |
| INVENTOR(S) | : Staples et al. |

Page 1 of 1

It is certified that error appears in the above-identified patent and that said Letters Patent is hereby corrected as shown below:

In column 6, line 16, delete "disired" and insert -- desired --, therefor.

In column 7, line 16, in Claim 7, after "signal" delete "." and insert -- , --, therefor.

In column 7, line 40, in Claim 9, after "forming" delete "a".

In column 10, line 27, in Claim 26, after "transistors" delete "." and insert -- , --, therefor.

Signed and Sealed this

Twenty Second Day of April, 2008

JON W. DUDAS
*Director of the United States Patent and Trademark Office*